United States Patent
Franz et al.

(10) Patent No.: US 10,080,303 B2
(45) Date of Patent: Sep. 18, 2018

(54) INTERLOCK BRACKET UNIT

(71) Applicant: Hewlett Packard Enterprise Development LP, Houston, TX (US)

(72) Inventors: John Franz, Houston, TX (US); Alan Doerr, Magnolia, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/534,933

(22) PCT Filed: Dec. 9, 2014

(86) PCT No.: PCT/US2014/069193
§ 371 (c)(1),
(2) Date: Jun. 9, 2017

(87) PCT Pub. No.: WO2016/093796
PCT Pub. Date: Jun. 16, 2016

(65) Prior Publication Data
US 2017/0354051 A1    Dec. 7, 2017

(51) Int. Cl.
*H05K 7/14*    (2006.01)
(52) U.S. Cl.
CPC ......... *H05K 7/1404* (2013.01); *H05K 7/1489* (2013.01)
(58) Field of Classification Search
CPC ...... H05K 5/0208; H05K 7/14; H05K 7/1411; H05K 7/1487; H05K 7/1489; H05K 7/1404
See application file for complete search history.

(56) References Cited

U.S. PATENT DOCUMENTS

| | | |
|---|---|---|
| 5,485,932 A | 1/1996 | Romm |
| 5,896,273 A | 4/1999 | Varghese |
| 6,615,993 B1 | 9/2003 | Rudiger |
| 6,773,080 B2 | 8/2004 | Chen |
| 6,948,691 B2 | 9/2005 | Brock |
| 7,281,694 B2 | 10/2007 | Allen |
| 7,552,899 B2 | 6/2009 | Chen |
| 8,146,756 B2 * | 4/2012 | Brock .................. A47B 96/06 211/192 |

(Continued)

FOREIGN PATENT DOCUMENTS

| | | |
|---|---|---|
| EP | 2440027 A2 | 4/2012 |
| WO | WO-2010138824 | 12/2010 |
| WO | WO-2014142865 A1 | 9/2014 |

*Primary Examiner* — Hoa C Nguyen
*Assistant Examiner* — Christopher L Augustin
(74) *Attorney, Agent, or Firm* — Hewlett Packard Enterprise Patent Department

(57) ABSTRACT

An example bracket unit to control installation of an electronic module is provided herein. The bracket unit includes a bracket body, a bracket plate, and a fastener. The bracket plate includes a receiving member and an alignment indicator. The receiving member to engage with a rail unit and move between an equilibrium position and a displaced position based on a movement of the rail unit. The alignment indicator connected to the receiving member, such that movement of the alignment indicator corresponds to the movement of the receiving member. The fastener to slideably connect the bracket plate and the bracket body together.

20 Claims, 8 Drawing Sheets

(56) References Cited

U.S. PATENT DOCUMENTS

| | | | |
|---|---|---|---|
| 8,550,416 B2* | 10/2013 | Yu | H05K 7/1489 |
| | | | 248/241 |
| 9,078,349 B1* | 7/2015 | Lewis | H05K 5/0204 |
| 2004/0080247 A1 | 4/2004 | Dobler | |
| 2008/0298014 A1 | 12/2008 | Franco | |
| 2010/0142135 A1* | 6/2010 | Carney | H05K 7/1415 |
| | | | 361/679.02 |
| 2013/0292522 A1* | 11/2013 | Sears | A47B 21/0371 |
| | | | 248/118 |
| 2015/0048041 A1* | 2/2015 | Chuang | H05K 7/1489 |
| | | | 211/175 |

* cited by examiner

INTERLOCK BRACKET UNIT

BACKGROUND

Electronic devices have temperature requirements. Heat from the use of the electronic devices is controlled using cooling systems. Examples of cooling systems include air and liquid cooling.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

Figure 1:
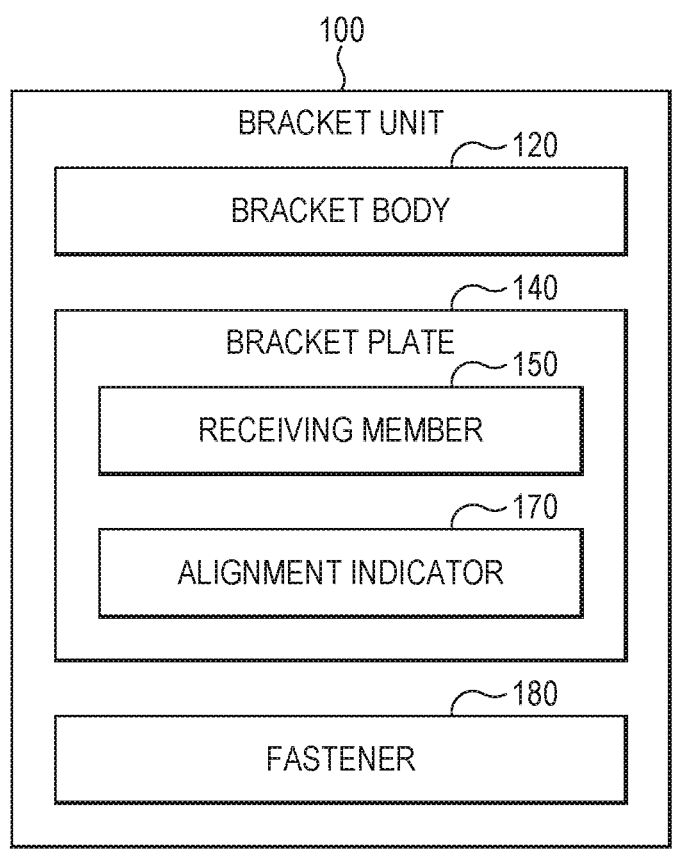
FIG. 1 illustrates a block diagram of a bracket unit according to an example.

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

The liquid cooling solutions that exist for server equipment typically include fluid connections between a server and a cooling device positioned at either the front or rear of the server. For example, the connection may be formed by manual connection of tubes or a blind mate system. A connection in a dry disconnect liquid cooling system works efficiently when the server and a cooling device are properly aligned. When the connection between the server and cooling device is not properly aligned the heat may not transfer efficiently. Moreover, the server or cooling device may be damaged when the two are not properly aligned.

The phrase "electronic module" as used herein refers to a computing device, such as a server, a blade server, or a server cartridge that provides computer solutions, storage solutions, network solutions, and/or cloud services.

The phrase "thermal module" as used herein refers to any mechanism to cool or remove heat from the electronic module. The thermal module may also be referred to as a cooling module. A thermal bus bar that collects heat from the electronic module and removes the heat from a server rack is an example of a thermal or cooling module.

The phrase "dry disconnect" as used herein refers to a module assembly with cooling components that cool an electronic module using a liquid cooling method. The liquid cooling method uses a fluid manifold to direct a cooling fluid and a thermal mating member or surface that mates with the electronic module. For example, the thermal mating member may mate with a condenser plate or a heat block formed of a thermally conductive material to receive heat from the electronic module.

The phrase "wet disconnect" as used herein refers to a module assembly with cooling components that cool an electronic module using a liquid cooling method that transfers fluid between the thermal or cooling module and the electronic module using wet or liquid connections that transfer a fluid therethrough.

The phrase "water wall" as used herein refers to a structure formed to distribute the liquid to the wet disconnect connection or the fluid manifold in the dry disconnect. The water wall is typically connected to the rack adjacent to the electronic module.

In examples, a bracket unit to control installation of an electronic module is provided. The bracket unit includes a bracket body, a bracket plate, and a fastener. The bracket plate includes a receiving member and an alignment indicator. The receiving member to engage with a rail unit and move between an equilibrium position and a displaced position based on a movement of the rail unit. The alignment indicator connected to the receiving member, such that movement of the alignment indicator corresponds to the movement of the receiving member. The fastener to slideably connect the bracket plate and the bracket body together.

FIG. 1 illustrates a block diagram of a bracket unit 100 according to an example. The bracket unit 100 controls installation of an electronic module. The bracket unit 100 includes a bracket body 120, a bracket plate 140, and a fastener 180. The bracket plate 140 includes a receiving member 150 and an alignment indicator 170. The receiving member 150 to engage with a rail unit and move between an equilibrium position and a displaced position based on a movement of the rail unit. The alignment indicator 170 connected to the receiving member 150, such that movement of the alignment indicator 170 corresponds to the movement of the receiving member 150. The fastener 180 to slideably connect the bracket plate 140 and the bracket body 120 together.

Figure 2B:
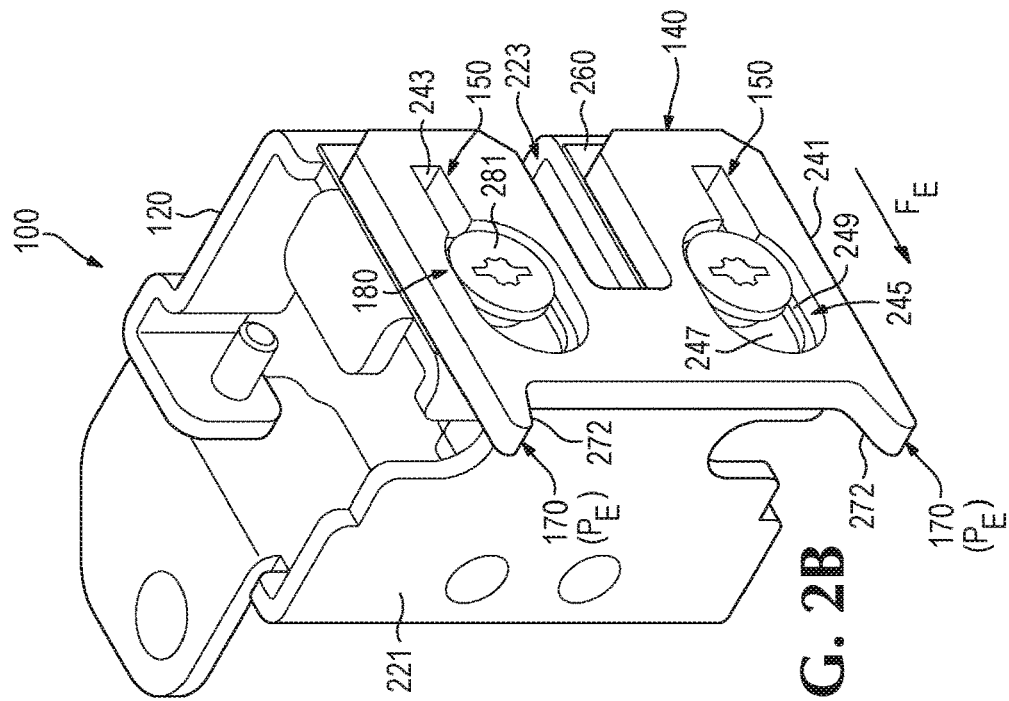
FIGS. 2A-2B illustrate a front perspective view of he bracket unit of FIG. 1 according to an example.
Figure 2A:
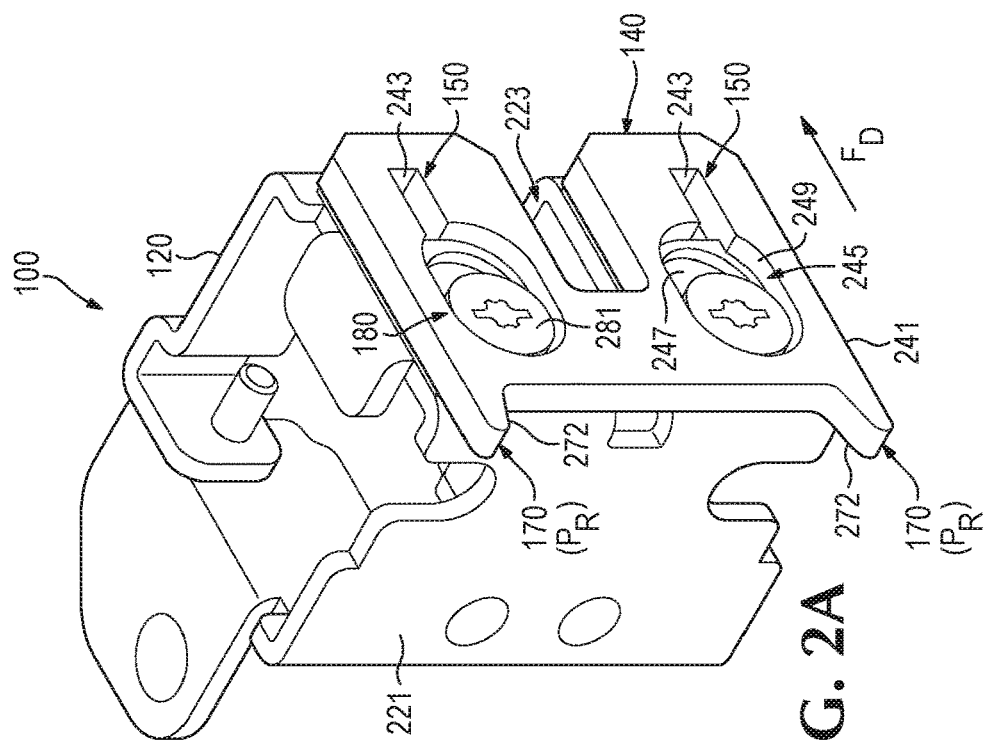
Figure 3:
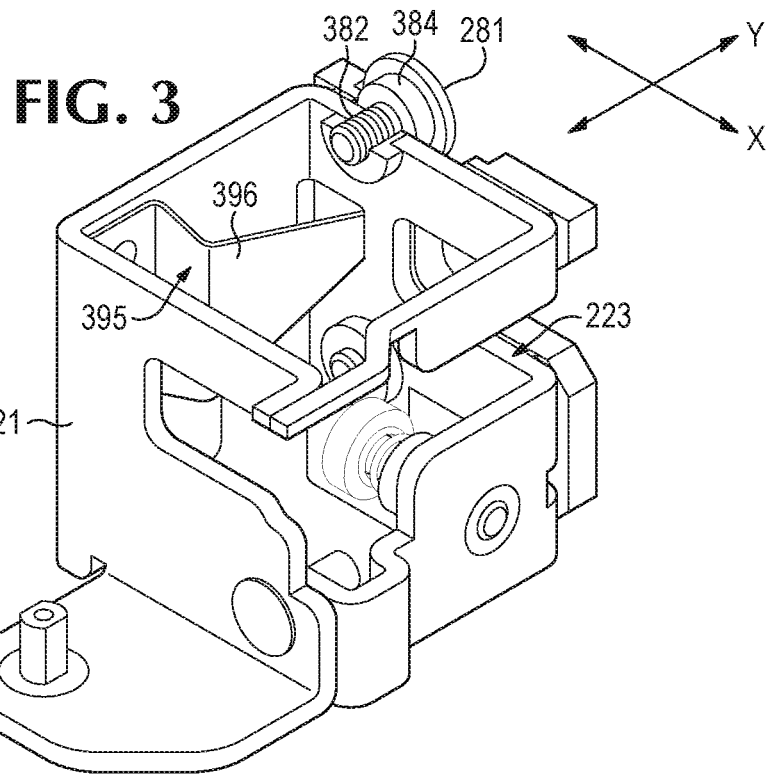
FIG. 3 illustrates an bottom perspective view of a bracket unit of FIG. 1 according to an example.
Figure 4:
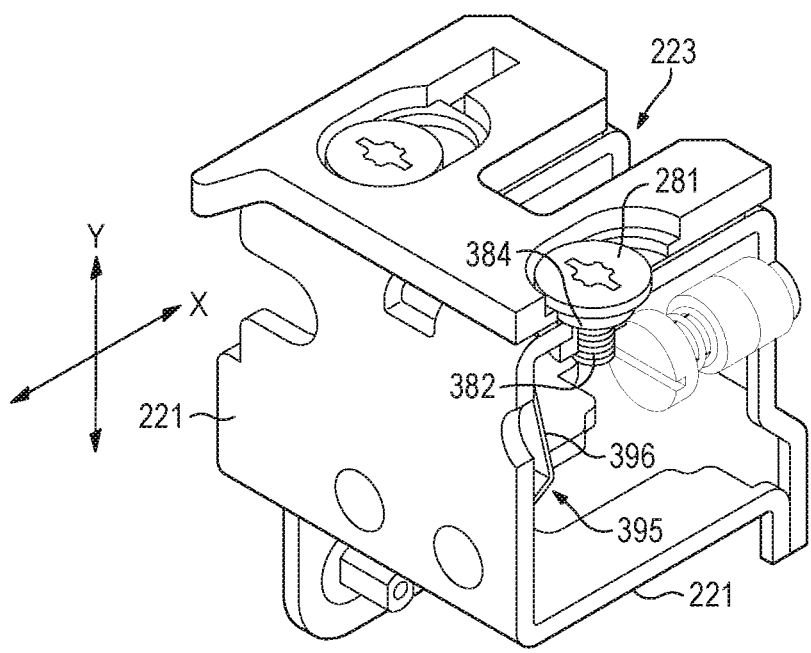
FIG. 4 illustrates a cross-sectional view of a bracket unit of FIG. 1 according to an example.

Referring to FIGS. 2A-4, examples of the bracket unit 100 are illustrated. FIGS. 2A-2B illustrate a front perspective view of the bracket unit 100 of FIG. 1 according to an example, FIG. 3 illustrates a bottom perspective view of a bracket unit 100 of FIG. 1 according to an example. FIG. 4 illustrates a cross-sectional view of the bracket unit 100 of FIG. 1 according to an example.

The bracket unit 100 illustrated includes the bracket body 120, the bracket plate 140, and the fastener 180. The bracket body 120 is illustrated as a support structure with perimeter walls 221 and a rail aperture 223 to permit movement of a rail unit. The bracket plate 140 is illustrated as a planar member 241. The bracket plate 140 includes the alignment indicator 170 extending from one side and two sets of receiving members 150 formed therein.

The alignment indicator 170 is illustrated as two protrusions 272 that extend from the bracket plate 140 to block a portion of the area adjacent to the bracket unit 100. Referring to FIGS. 2A-2B, the alignment indicators 170 are illustrated as moving horizontally between a retracted position, $P_R$ (FIG. 2A), and an extended position, $P_E$ (FIG. 2B). The protrusions 272 that form the alignment indicators 170 are illustrated as an extension of the bracket plate 140; however, the alignment indicators 170 may include additional designs that are formed in the bracket plate 140, extend from the bracket plate 140, and/or attach to the bracket plate 140. Moreover, the alignment indicators 170 may move with the bracket plate 140 as a unitary member and/or with the bracket plate 140 with a range of motion proportional to the motion of the bracket plate 140.

The position of the alignment indicators 170 are determined by the movement of the bracket plate 140, which is controlled by the position of the receiving members 150. The receiving members 150 are illustrated in the shape of rectangular slots; however, the number, size, and shape of the slots may vary depending on the design and configuration. For example, the receiving member 150 may include an interlock aperture 243 to receive an interlocking member extending from the rail unit. The interlock aperture 243 may receive an interlocking member of various sizes and shapes. The interlock aperture 243 may be formed to mate with or engage with the interlocking member to provide a method to control movement of the bracket plate 140.

The bracket plate 140 may further include a positioning groove 245 to slideably receive the fastener 180. The positioning groove 245 is illustrated to include a positioning aperture 247 to receive the fastener 180 and an indentation 249 around the positioning aperture 247 to mate with the fastener 180. The positioning groove 245 is illustrated as an oblong shape formed to receive the fastener 180 and enable slideable movement therealong. Referring to FIGS. 2A-4, for example, the fastener 180 may include a shoulder screw 281 having a threaded portion 382 that connects the bracket plate 140 to the bracket body 120 along a first axis(i.e., y-axis), and a non-threaded portion 384 that permits movement of the shoulder screw along a second axis (i.e., x-axis) perpendicular to the first axis. The shoulder screw 281 provides a fastener 180 which permits slideable movement that may be controlled by the interlocking member.

As illustrated in FIGS. 2A-2B, the bracket plate 140 moves horizontally along the positioning groove 245. The positioning groove 245 is illustrated to permit horizontal motion; however, the motion directed by the positioning groove 245 may vary. For example, the bracket plate 140 may move left to right with the fastener 180 moving horizontally along the positioning groove 245. The movement may be controlled or determined by a force applied to the receiving members 150, such that the interlock aperture 243 may receive a force from an interlock member on a rail unit to control the positioning $F_E$, $F_D$ of the bracket unit 100.

The bracket unit 100 may further include a material having a low coefficient of friction to facilitate the movement or sliding movement. The material may include a coating on one or both of the bracket body 120 and the bracket plate 140, or a separate member, such as a connector plate 260. For example, the connector plate 260 may be positioned between the bracket plate 120 and the bracket body 140. The connector plate 260 having a low coefficient of friction to assist with movement of the bracket plate.

The bracket unit 100 may further include a biasing member 395 to align the bracket plate 140. For example, the biasing member 395 may include a biasing spring 396, such as a cantilever spring, as illustrated in FIGS. 3-4. The biasing spring 396 to maintain vertical and lateral alignment and prevent twisting of the bracket unit 100. The biasing spring 396 returns or maintains the bracket plate 140 in the equilibrium position, $F_E$, when no force is applied to the receiving members 150 or the force is release from the receiving members 150. For example, referring back to FIG. 2B, the bracket plate 140 is illustrated in the equilibrium position, $F_E$, with no force applied to the receiving members 150. In contrast, FIG. 2A illustrates the bracket plate 140 in the displaced position, $F_D$, with a force applied to the receiving members 150 to move the bracket plate 140 according to the force applied thereto.

Figure 5:
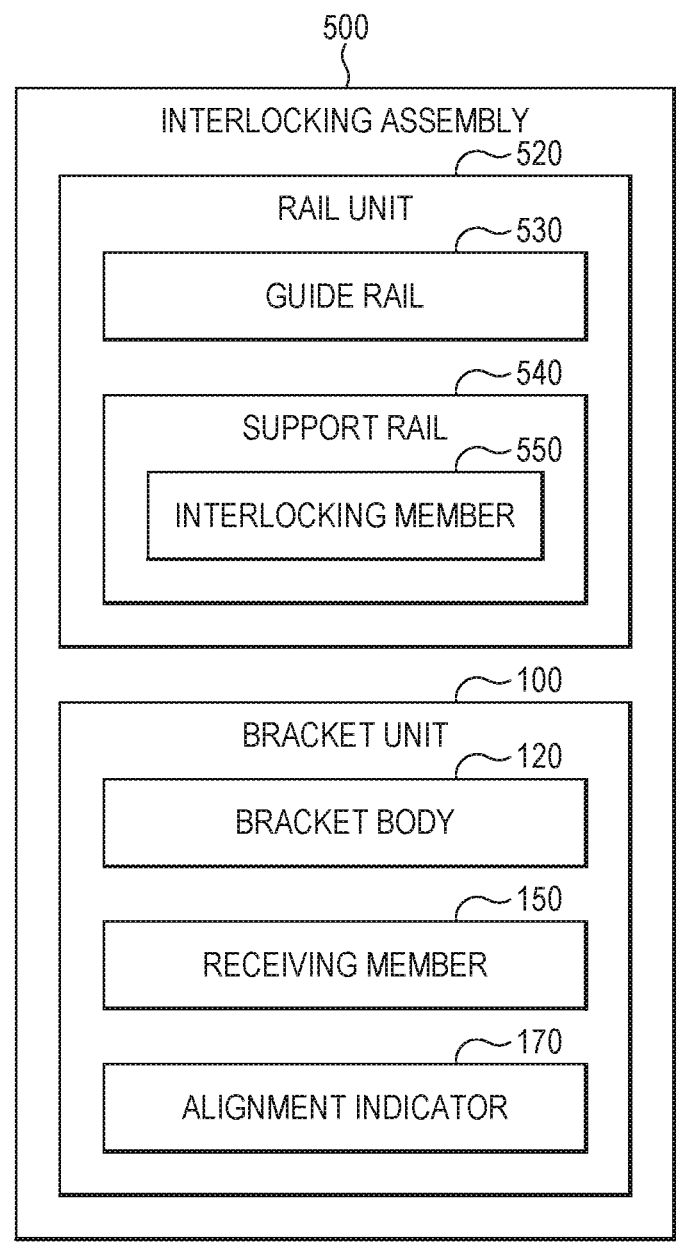
FIG. 5 illustrates a block diagram of an interlocking assembly according to an example.

FIG. 5 illustrates a block diagram of an interlocking assembly 500 according to an example. The interlocking assembly 500 includes a rail unit 520 and a bracket unit 100. The rail unit 520 includes a guide rail 530 and a support rail 540. The guide rail 530 to move along a first axis, and the support rail 540 to control movement along a second axis. The support rail 540 includes an interlocking member 550.

The bracket unit 100 to mate with the support rail 560. The bracket unit 100 includes a bracket body 120, a receiving member 150, and an alignment indicator 170. The receiving member 150 connected to the bracket body 120. The receiving member 150 to engage with the interlocking member 550. When engaged, the interlocking member 550 to determine a position of the receiving member 150. The alignment indicator 170 is connected to the receiving member 150 to move based on the position of the receiving member 150.

Figure 6:
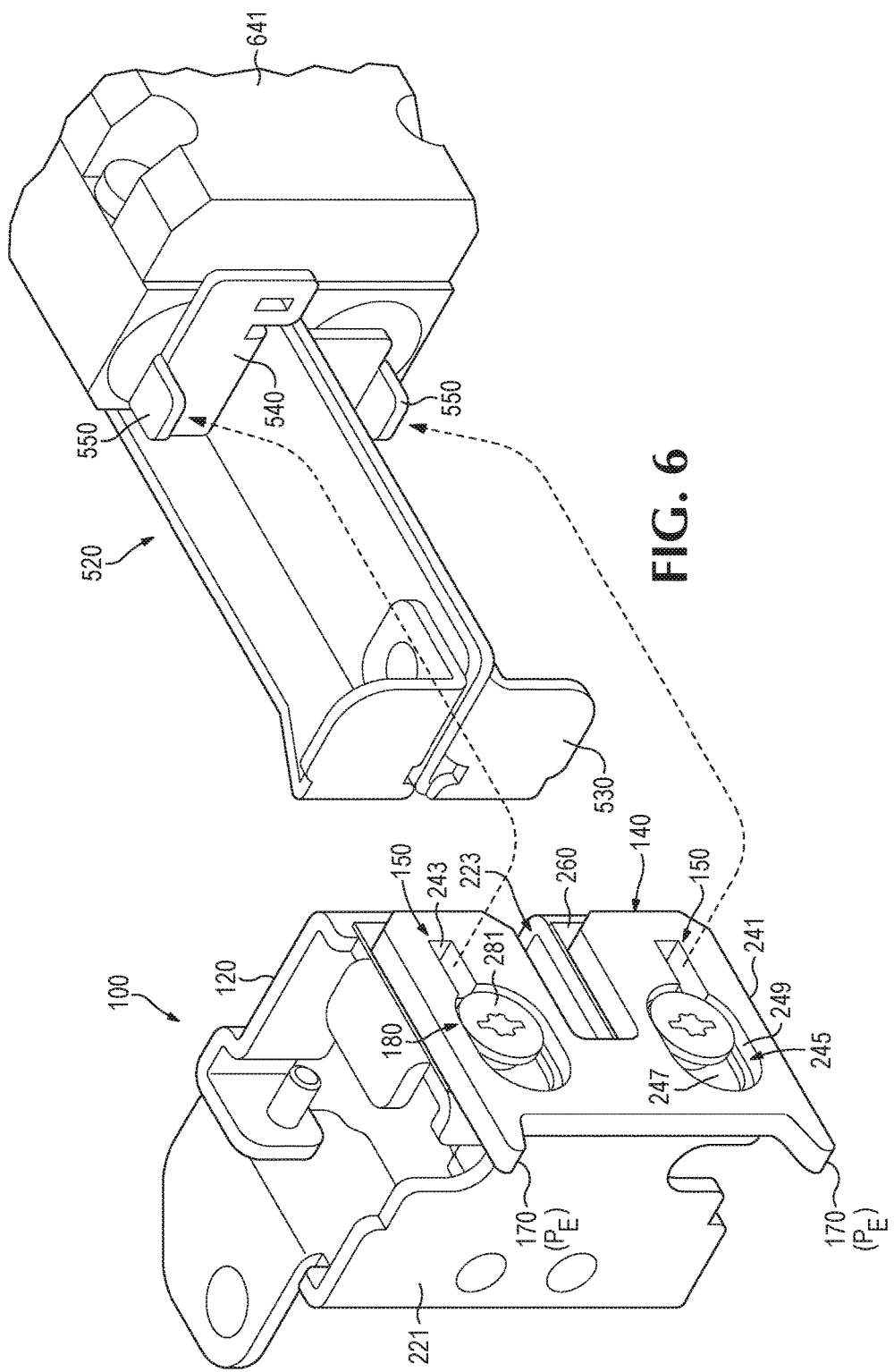
FIG. 6 illustrates a schematic view of the interlocking assembly of FIG. 5 according to an example.
Figure 7:
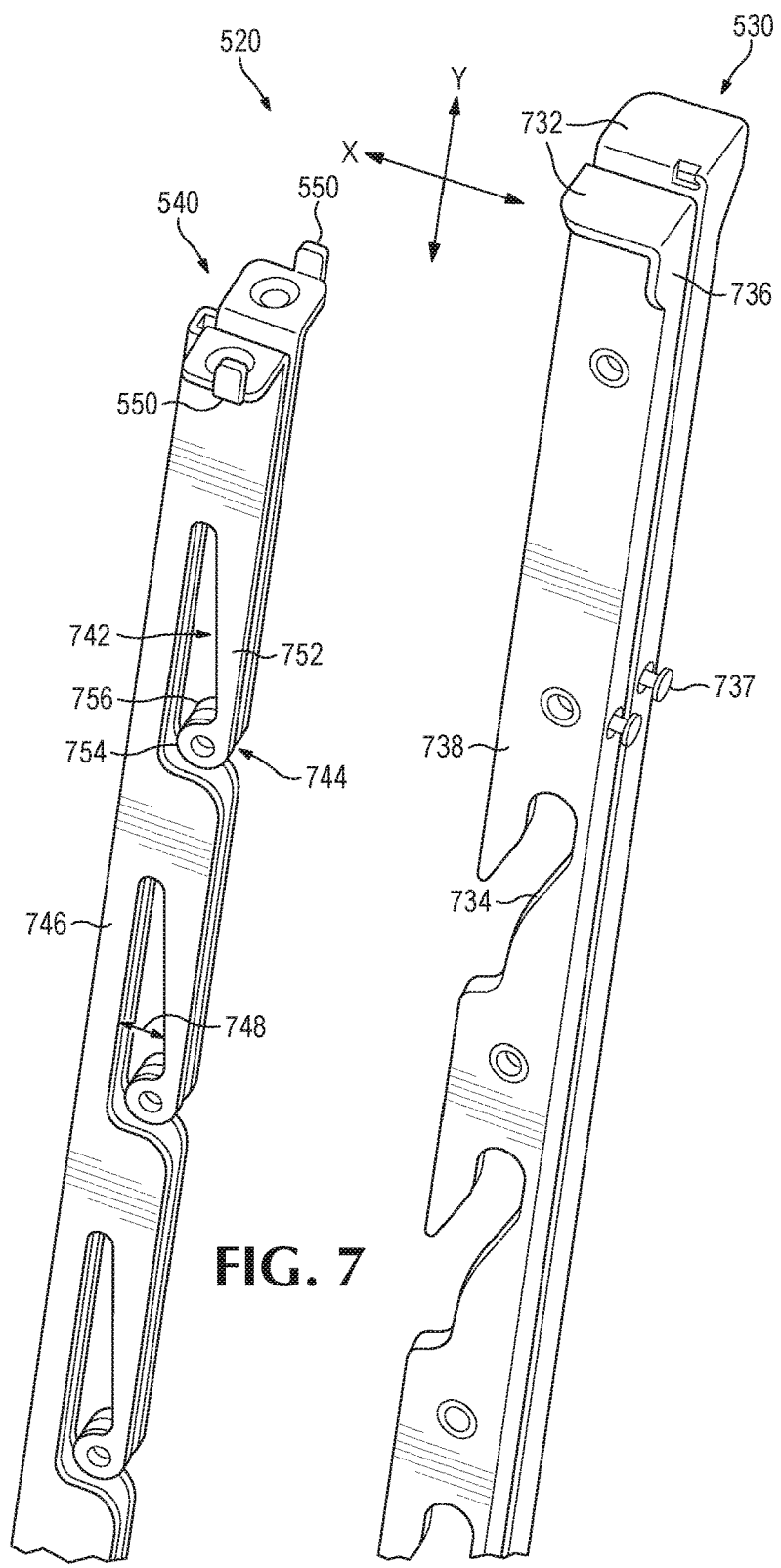
FIG. 7 illustrates a partially exploded view of the rail unit of FIG. 5 according to an example.

FIG. 6 illustrates a schematic view of the interlocking assembly 500 of FIG. 5 according to an example. The interlocking assembly 500 includes the rail unit 520 and the bracket unit 100. The rail unit 520 includes a guide rail 530 and a support rail 540 with an interlocking member 550. FIG. 7 illustrates a partially exploded view of the rail unit of FIG. 5 according to an example. The rail unit 520 includes a guide rail 530 and a support rail 540. The guide rail 530 includes a flange 732 and a guide track 734. For example, the guide rail 530 includes a planar guide 736 with a guide wall 738 having the guide track 734 formed therein. The flange 732 extends from the planar guide 736. The flange 732 is illustrated as a T-shaped flange.

The support rail 540 includes a spring member 742 and an engagement mechanism 744. The spring member 742 to control the mating of at least one electronic component selected from a first electronic component and a second electronic component along a second axis, i.e., the x-axis. The spring member 742 controls the mating through use of a spring force and provides for tolerance compliance by the movement illustrated through arrow 748. The engagement mechanism 744 is connected to the spring member 742. The engagement mechanism 744 moves along the guide track 734 as the hook member 814 (illustrated in FIG. 8) moves the guide rail 530. The movement of the guide track 734 to displace the rail unit 520 and enable the first electronic component and the second electronic component to mate along the x-axis.

For example, the spring member 742 includes a cantilever spring 752 and the engagement mechanism 744 includes a roller 754 connected to the cantilever spring 752 via a bracket 756 that extends from the support rail 540. The support rail 540 may include a planar engagement structure 746. The planar guide 736 may be formed to receive the planar engagement structure 746, such that the planar engagement structure 746 and the planar guide 736 mate, and the engagement mechanism 744 and the guide track 734 engage with one another. Movement of the guide rail 530 moves the engagement mechanism 744, such as, the roller 754, along the guide track 734 and displaces the spring member 742, such as, the cantilever spring 752, to mate the first electronic component and the second electronic component along the second axis.

Figure 8:
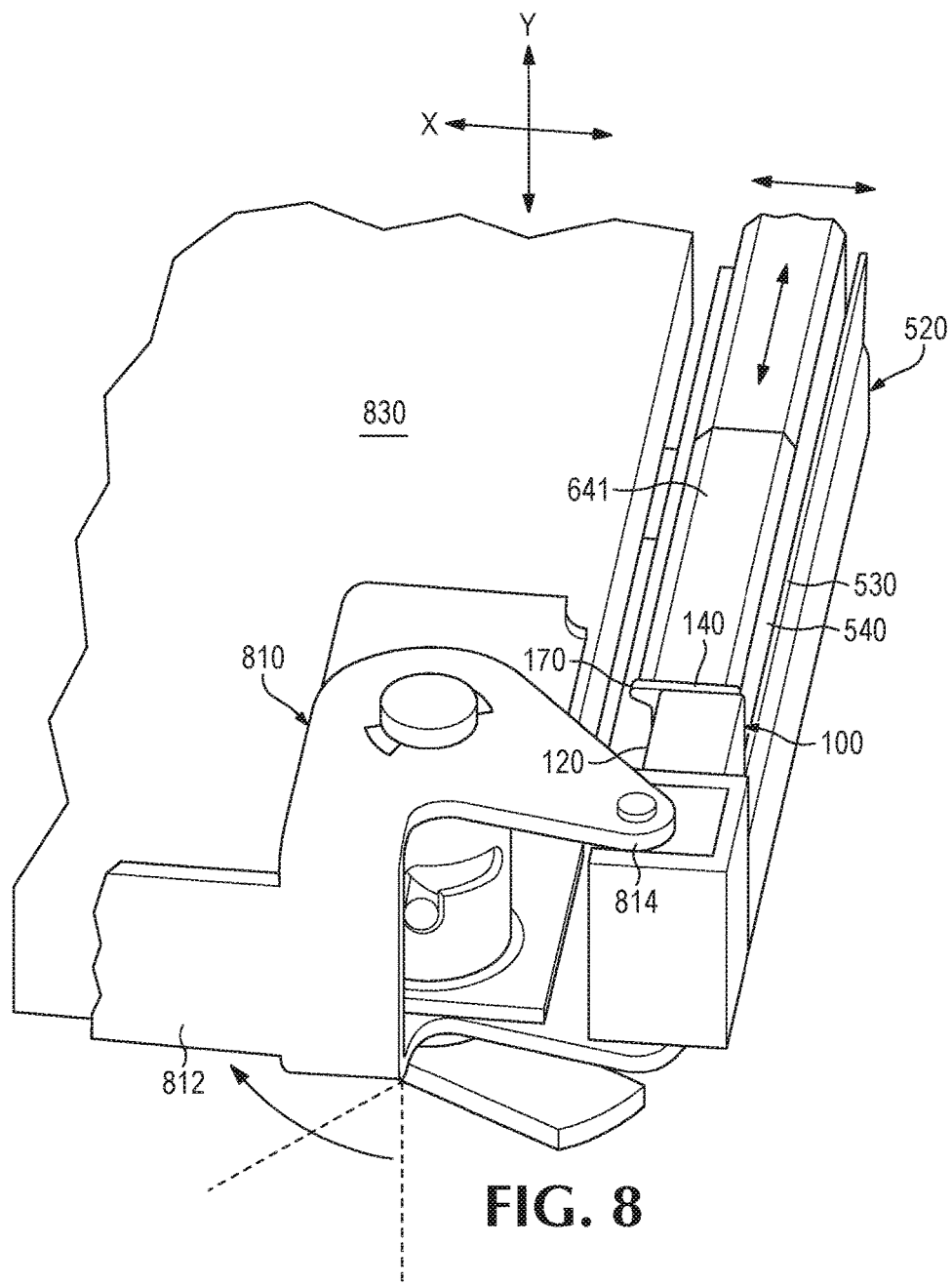
FIG. 8 illustrates a perspective view of the interlocking assembly of FIG. 5 with a lever unit and an electronic module usable with the interlocking assembly according to an example.

FIG. 8 illustrates a perspective view of the interlocking assembly 500 of FIG. 5 with a lever unit 810 and an electronic module 830 usable with the interlocking assembly according to an example. The lever unit 810 and the rail unit 520, in cooperation, move the engagement mechanism 744 along the guide track 734. The lever unit 810 includes a handle 812 and a hook member 814. The hook member 814 to engage with the flange 732 to move the guide rail 530 along the first axis, i.e., the y-axis. The guide rail 530 may further include a rack pin 737 that extends from the planar guide 736 and is formed to connect the rail unit 520 to a rack, i.e., a server rack. The spring member 742 provides a spring force that controls the mating and provides for tolerance compliance to complete the mating of the first electronic component and the second electronic component in a controlled manner. As illustrated in FIGS. 6 and 8, the support rail 540 includes a thermal module 641 connected thereto, Referring back to FIG. 6, the bracket unit 100 includes a bracket body 120 and a bracket plate 140. The bracket unit 100 further comprises a bracket plate 140 that includes the receiving member 150 and the alignment indicator 170. The bracket plate 140 is moveably connected to the bracket body 120, as illustrated above in FIGS. 2A-4. Movement is facilitated through a track or positioning groove 245. For example, the bracket unit 100 may further include a positioning groove 245 to receive a fastener 180, such as a shoulder screw that slideably connects to the positioning groove 245. The positioning groove 245 and the fastener 180 to define a path for the movement of the receiving member 150 between the first position and the second position. For example, the movement may be vertical, horizontal, and/or diagonal.

The alignment indicator 170 moves between an extended position and a retracted position, based on movement of the receiving member 150 between a first position and a second position, as controlled by the movement of the interlocking member 550. For example, FIG. 6 illustrates the receiving member 150 in a first position or an extended position, with the alignment indicator 170 extended. FIG. 2B illustrates the receiving member in the second position or retracted position, $P_R$, with the alignment indicator 170 contracted.

The bracket unit 100 may further include a biasing member 395 connected to the receiving member 150. The biasing member 395 to maintain proper alignment of the bracket unit 100. For example, the biasing member 395 may be connected to the bracket plate 140 and control movement with respect to the vertical and horizontal alignment, as illustrated in FIGS. 3-4.

Figure 9:
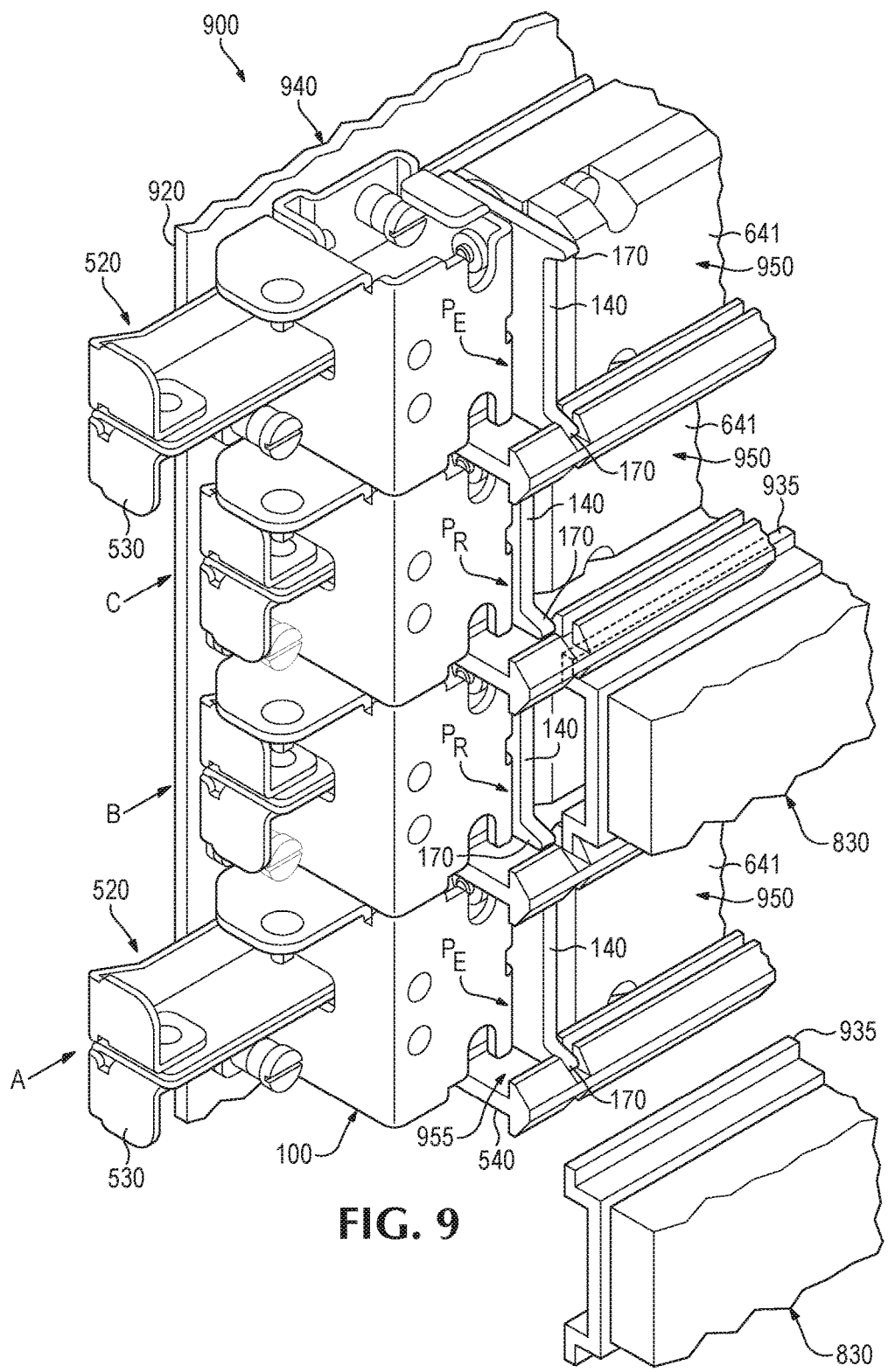
FIG. 9 illustrates a portion of a rack system that includes an electronic module usable with the interlocking assembly of FIG. 5 according to an example.

FIG. 9 illustrates a portion of a rack system 900 that includes an electronic module 830 usable with the interlocking assembly 500 of FIG. 5 according to an example. The system 600 illustrates a portion of the server rack 920 with a water wall 940. The water wall 940 illustrated includes thermal receiving members 950 each formed to receive a thermal module 641, such as a thermal bus bar for cooling via a dry disconnect liquid cooling system or a water wall 940 for cooling via a wet disconnect liquid cooling system. As illustrated, the thermal module 641 includes a rail unit 520 and an electronic module 830 attached to one of the thermal receiving members 950. The electronic module 830 is electrically connected to the backplane (not illustrated) and thermally connected to the thermal module 641. The positioning of the thermal module 641 and the electronic module 830 is accomplished using the interlock assembly 500 described herein.

For example, row A illustrates the rail unit 520 extended. When the rail unit 520 is extended, the alignment indicators 170 are also in an extended position $P_E$. In the extended position, the receiving members 150 and the interlock members 550 (as illustrated in FIG. 6) are engaged and the bracket plate 140 is extended. In the extended position, $P_E$, a force, $F_D$, is applied by the interlock member 550 to displace the bracket plate 140.

In contrast, the thermal receiving member 950 in row B is illustrated with the electronic module 830 installed. In order for the electronic module 830 to be installed, the alignment indicators 170 are in a retracted position, $P_R$, as better illustrated in row C. In the retracted position, $P_R$, the receiving members 150 and the interlock members 550 are engaged and the bracket plate 140 remains in the retracted position $P_R$. In the retracted position, $P_R$, no force, $F_E$, from the interlock members 550 is applied to the bracket plate 140.

FIG. 9 further illustrates an example of the connection between the thermal receiving members 950 and the electronic modules 830 via a channel 955 formed in the thermal receiving members 950 to receive a ledge 935 formed in the electronic module 830. The channel 955 forms a cavity that holds the electronic module 830 therein. The bracket unit 100, and more specifically, the alignment indicators 170 are formed to block the channel 955 in the extended position, $P_E$, and prevent insertion of the electronic modules 830, Conversely, in the retracted position, $P_R$, the alignment indicators 170 are formed to not interfere with the channel 955 and the insertion of the electronic modules 830.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:
1. An interlocking assembly comprising:
   a rail unit comprising a guide rail to move along a first axis and a support rail to control movement along a second axis, the support rail including an interlocking member; and
   a bracket unit to engage with the support rail, the bracket unit including:
      a bracket body, a receiving member connected to the bracket body, the receiving member to engage with the interlocking member, when engaged the interlocking member to determine a position of the receiving member,
an alignment indicator connected to the receiving member to move based on the position of the receiving member, and
a bracket plate including the receiving member and the alignment indicator, the bracket plate moveably connected to the bracket body.

2. The interlocking assembly of claim 1, further comprising a biasing member connected to the receiving member, the biasing member to maintain proper alignment of the bracket unit.

3. The interlocking assembly of claim 1, wherein the alignment indicator moves between an extended position and a retracted position, the movement of the alignment indicator corresponds to the receiving member between a first position and a second position.

4. The interlocking assembly of claim 1, wherein the bracket unit further comprises a track to receive a fastener, the fastener to slideably connect to the track.

5. The interlocking assembly of claim 1, wherein the support rail comprises a channel to receive an electronic component.

6. The interlocking assembly of claim 1, wherein the support rail includes a spring member and an engagement mechanism, the spring member to control a mating of at least one electronic component selected from a first electronic component and a second electronic component along the second axis using a spring force, the engagement mechanism connected to the spring member, the engagement mechanism to move along the guide rail, movement of the guide rail to displace the rail unit and mate the first electronic component and the second electronic component along the second axis.

7. The interlocking assembly of claim 6, wherein the engagement mechanism further comprises a roller.

8. The interlocking assembly of claim 6, wherein the spring member comprises a cantilever spring.

9. A bracket unit to control installation of an electronic module, the bracket unit comprising:
a bracket body;
a bracket plate moveably connected to the bracket body, the bracket plate including:
a receiving member to engage with a rail unit, the receiving member to move between an equilibrium position and a displaced position based on a movement of the rail unit, and
an alignment indicator connected to the receiving member such that movement of the alignment indicator corresponds to the movement of the receiving member; and
a fastener to slideably connect the bracket plate and the bracket body together.

10. The bracket unit of claim 9, wherein the receiving member further comprises an interlock aperture to receive an interlocking member extending from the rail unit.

11. The bracket unit of claim 9, further comprising a positioning groove to slideably receive the fastener.

12. The bracket unit of claim 9, further comprising a connector plate between the bracket plate and the bracket body, the connector plate including a low coefficient of friction to assist with movement of the bracket plate.

13. The bracket unit of claim 9, wherein the fastener comprises a shoulder screw.

14. The bracket unit of claim 9, further comprising a biasing member to align the bracket plate.

15. An interlocking assembly comprising:
a rail unit comprising a guide rail to move along a first axis and a support rail to control movement along a second axis, the support rail including an interlocking member, the support rail includes a spring member and an engagement mechanism, the spring member to control a mating of at least one electronic component selected from a first electronic component and a second electronic component along the second axis using a spring force, the engagement mechanism connected to the spring member, the engagement mechanism to move along the guide rail, movement of the guide rail to displace the rail unit and mate the first electronic component and the second electronic component along the second axis; and
a bracket unit to engage with the support rail, the bracket unit including:
a bracket body,
a receiving member connected to the bracket body, the receiving member to engage with the interlocking member, when engaged the interlocking member to determine a position of the receiving member, and
an alignment indicator connected to the receiving member to move based on the position of the receiving member.

16. The interlocking assembly of claim 15, wherein the alignment indicator moves between an extended position and a retracted position, the movement of the alignment indicator corresponds to the receiving member between a first position and a second position.

17. The interlocking assembly of claim 15, wherein the bracket unit further comprises a track to receive a fastener, the fastener to slideably connect to the track.

18. The interlocking assembly of claim 15, wherein the support rail comprises a channel to receive an electronic component.

19. The interlocking assembly of claim 15, further comprising a biasing member connected to the receiving member, the biasing member to maintain proper alignment of the bracket unit.

20. The interlocking assembly of claim 15, wherein the bracket unit further comprises a bracket plate including the receiving member and the alignment indicator, the bracket plate moveably connected to the bracket body.

\* \* \* \* \*